United States Patent
Chen et al.

(10) Patent No.: US 10,147,609 B2
(45) Date of Patent: Dec. 4, 2018

(54) SEMICONDUCTOR EPITAXY BORDERING ISOLATION STRUCTURE

(71) Applicant: Taiwan Semiconductor Manufacturing Co., Ltd., Hsinchu (TW)

(72) Inventors: Wen-Chin Chen, Kaohsiung (TW); Cheng-Yi Wu, Taichung (TW); Yu-Hung Cheng, Tainan (TW); Ren-Hua Guo, Taichung (TW); Hsiang Liu, Hsinchu (TW); Chin-Szu Lee, Taoyuan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/475,826

(22) Filed: Mar. 31, 2017

(65) Prior Publication Data
US 2018/0175196 A1   Jun. 21, 2018

Related U.S. Application Data

(60) Provisional application No. 62/434,966, filed on Dec. 15, 2016.

(51) Int. Cl.
*H01L 21/336* (2006.01)
*H01L 29/78* (2006.01)
(Continued)

(52) U.S. Cl.
CPC ........ *H01L 21/2022* (2013.01); *H01L 29/045* (2013.01); *H01L 29/66287* (2013.01)

(58) Field of Classification Search
CPC .................................................. H01L 21/2022
(Continued)

(56) References Cited

U.S. PATENT DOCUMENTS

| 7,547,616 B2* | 6/2009 | Fogel .................. H01L 21/2022 257/E21.347 |
| 8,487,378 B2 | 7/2013 | Goto et al. |

(Continued)

FOREIGN PATENT DOCUMENTS

| JP | 2015008206 | 1/2015 |
| TW | 200522196 | 7/2005 |

(Continued)

*Primary Examiner* — Calvin Lee
(74) *Attorney, Agent, or Firm* — Haynes and Boone, LLP

(57) ABSTRACT

A method includes providing a semiconductor structure having an active region and an isolation structure adjacent to the active region, the active region having source and drain regions sandwiching a channel region for a transistor, the semiconductor structure further having a gate structure over the channel region. The method further includes etching a trench in one of the source and drain regions, wherein the trench exposes a portion of a sidewall of the isolation structure, epitaxially growing a first semiconductor layer in the trench, epitaxially growing a second semiconductor layer over the first semiconductor layer, changing a crystalline facet orientation of a portion of a top surface of the second semiconductor layer by an etching process, and epitaxially growing a third semiconductor layer over the second semiconductor layer after the changing of the crystalline facet orientation.

20 Claims, 9 Drawing Sheets

(51) Int. Cl.
*H01L 21/20* (2006.01)
*H01L 29/66* (2006.01)
*H01L 29/04* (2006.01)

(58) Field of Classification Search
USPC .................. 257/49–51, 64–67, 69, 333, 396;
438/222, 226, 245, 269, 300
See application file for complete search history.

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,853,673 B2 * | 10/2014 | Shimamune ...... H01L 21/02381 257/19 |
| 8,887,106 B2 | 11/2014 | Ho et al. |
| 9,246,002 B2 | 1/2016 | Hsiao et al. |
| 9,337,316 B2 | 5/2016 | Tsai et al. |
| 2011/0210404 A1 | 9/2011 | Su et al. |
| 2012/0319166 A1 | 12/2012 | Adam et al. |
| 2013/0320434 A1 | 12/2013 | Shin et al. |
| 2014/0138769 A1 | 5/2014 | Haneda et al. |
| 2014/0282326 A1 | 9/2014 | Chen et al. |
| 2015/0295086 A1 | 10/2015 | Shimamune et al. |

FOREIGN PATENT DOCUMENTS

| | | |
|---|---|---|
| TW | 200623414 | 7/2006 |
| TW | 201250860 | 12/2012 |

\* cited by examiner

SEMICONDUCTOR EPITAXY BORDERING ISOLATION STRUCTURE

PRIORITY

This application claims the benefits of U.S. Provisional Application Ser. No. 62/434,966, filed on Dec. 15, 2016, the disclosure of which is incorporated herein in its entirety.

BACKGROUND

As semiconductor devices are scaled down progressively, strained source/drain (S/D) features (e.g., stressor regions) have been implemented using epitaxially grown semiconductor materials to enhance charge carrier mobility and improve device performance. For example, forming a metal-oxide-semiconductor field effect transistor (MOSFET) with stressor regions may epitaxially grow silicon (Si) to form raised S/D features for n-type devices, and epitaxially grow silicon germanium (SiGe) to form raised S/D features for p-type devices. Various techniques directed at shapes, configurations, and materials of these S/D features have been implemented to further improve transistor device performance. However, existing approaches in raised S/D formation have not been entirely satisfactory.

For example, forming raised S/D regions at an active region next to an isolation region (or structure) has been problematic. For example, trenches for growing epitaxial features at the boundary of the two regions may not have an ideal shape. Also these trenches are only partially surrounded by semiconductor material(s). As a result, epitaxial features grown from these trenches might be thinner than those grown completely within the active region. Consequently, when contact features are formed above these epitaxial features, contact landing might be slanted and contact resistance might be high. Improvements in these areas are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
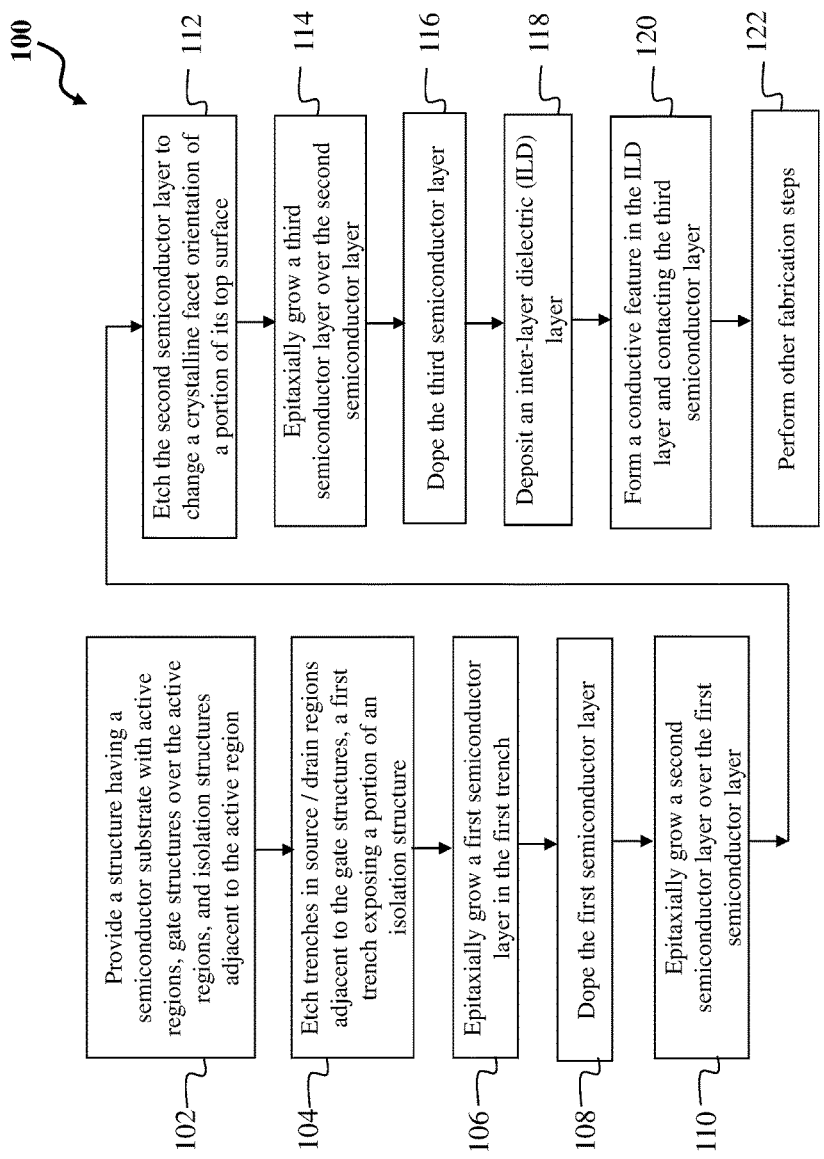
FIG. 1 shows a flow chart of a method of forming a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure in various embodiments is generally related to semiconductor devices and methods of forming the same. In particular, the present disclosure is related to forming raised epitaxial features in source and drain (S/D) regions of field effect transistors (FETs). According to an embodiment, some of the raised epitaxial features are formed adjacent to (or bordering) isolation structures, and include at least three layers of semiconductor materials. A first layer of the semiconductor material (e.g., silicon germanium) is epitaxially grown out of a trench partially surrounded by a semiconductor material (e.g., silicon). A second layer of the semiconductor material (e.g. silicon) is epitaxially grown over the first layer, and is then etched to change a crystalline facet orientation of at least a portion of its top surface. A third layer of the semiconductor material (e.g. silicon) is epitaxially grown over the second layer, wherein the changed crystalline facet of the second layer facilitates a vertical growth of the third layer of the semiconductor material. Advantageously, the third layer of the semiconductor material attains a desirable film thickness and facet for S/D contact landing. This and other embodiments of the present disclosure are further described by referring to FIGS. 1-9.

FIG. 1 illustrates a flow chart of a method 100 for forming semiconductor devices according to the present disclosure. The method 100 is an example, and is not intended to limit the present disclosure beyond what is explicitly recited in the claims. Additional operations can be provided before, during, and after the method 100, and some operations described can be replaced, eliminated, or relocated for additional embodiments of the method. The method 100 is described below in conjunction with FIGS. 2-9, which illustrate cross-sectional views of a semiconductor device 200 during various fabrication steps according to an embodiment of the method 100. The device 200 may be an intermediate device fabricated during processing of an integrated circuit (IC), or a portion thereof, that may comprise static random access memory (SRAM) and/or logic circuits, passive components such as resistors, capacitors, and inductors, and active components such as p-type FETs (PFETs), n-type FETs (NFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

Referring to FIG. 1, at operation 102, the method 100 provides a structure (or semiconductor structure) 200 that includes a semiconductor substrate with various active regions for forming transistors, gate structures over the active regions, and isolation structures adjacent to the active regions. An embodiment of the structure 200 is shown in FIG. 2.

Figure 2:
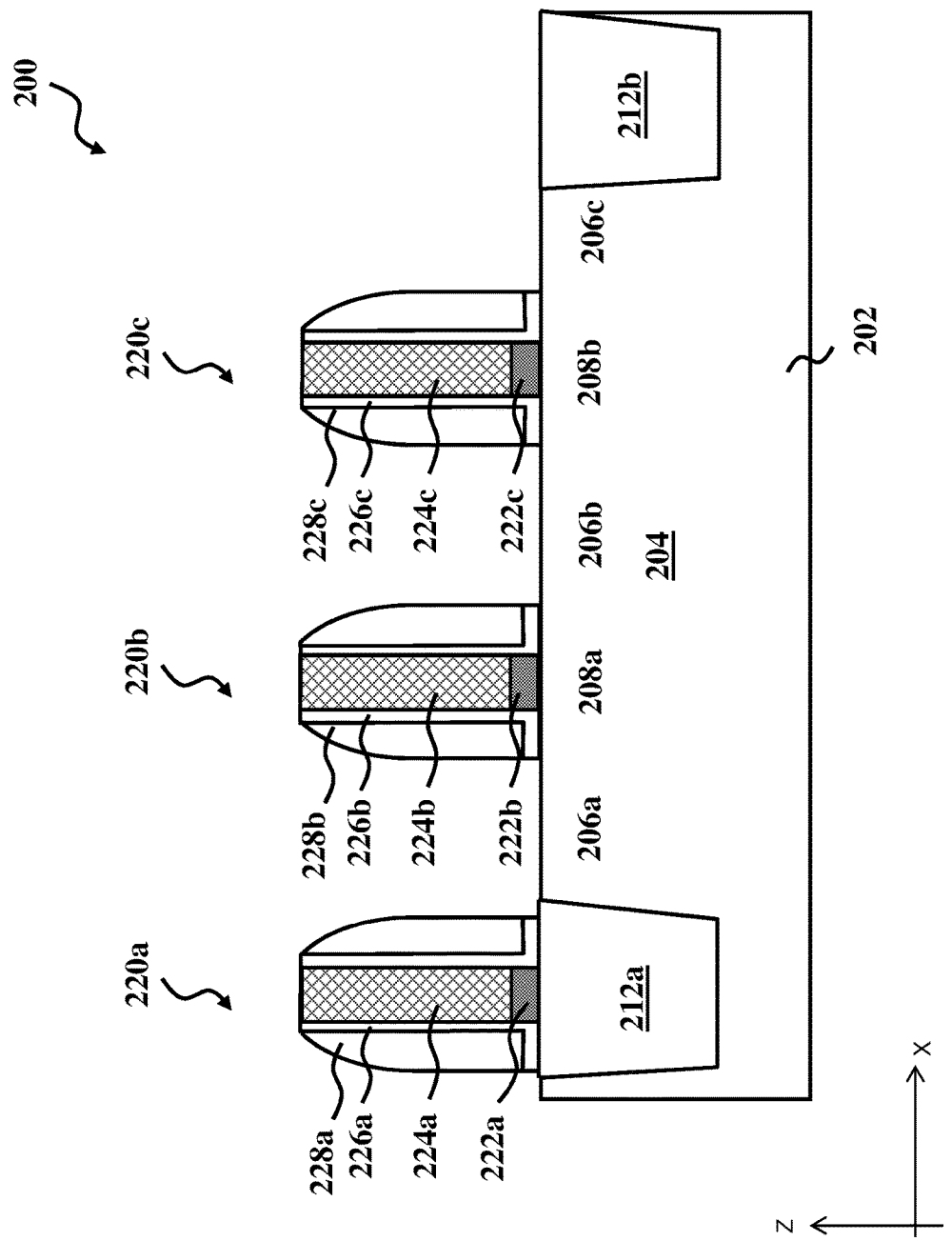
FIGS. 2, 3, 4, 5, 6, 7, 8, and 9 illustrate cross sectional views of forming a target semiconductor device according to the method of FIG. 1, in accordance with some embodiments.

Referring to FIG. 2, the structure 200 includes a substrate 202. The substrate 202 is a silicon substrate (e.g., comprising silicon in crystalline {110} faces) in the present embodiment. Alternatively, the substrate 202 may comprise another elementary semiconductor, such as germanium; a compound semiconductor such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; or combinations thereof. In yet another alternative, the substrate 202 is a semiconductor on insulator (SOI).

The substrate 202 includes an active region 204 that is isolated from other active regions of the substrate 202 by isolation structures 212a and 212b. In the present embodiment, the active region 204 is a p-type field effect transistor (FET) region, such as an n-well in a p-type substrate, for forming PFET. In another embodiment, the active region 204 is an n-type FET region for forming NFET. In yet another embodiment, the active region 204 includes both p-type FET region(s) and n-type FET region(s) for forming CMOS devices. In the present embodiment the active region 204 includes various source and drain (S/D) regions 206a, 206b, and 206c, and channel regions 208a and 208b that are sandwiched between a pair of S/D regions 206a-c. The S/D regions 206a-c may include lightly doped source/drain (LDD) features, and/or heavily doped source/drain (HDD) features. For example, the LDD and HDD features may be formed by a halo or lightly doped drain (LDD) implantation, source/drain implantation, source/drain activation, and/or other suitable processes. Particularly, the S/D region 206a is adjacent to the isolation structure 212a, the S/D region 206c is adjacent to the isolation structure 212b, and the S/D region 206b is completely within the active region 204.

The isolation structures 212a and 212b are at least partially embedded in the substrate 202 and may be formed of silicon oxide, silicon nitride, silicon oxynitride, fluoride-doped silicate glass (FSG), a low-k dielectric material, and/or other suitable insulating material. The isolation structures 212a-b may be shallow trench isolation (STI) features. In an embodiment, the isolation structures 212a-b are STI features formed by etching trenches in the substrate 202, filling the trenches with one or more isolating materials, and planarizing the isolating materials with a chemical mechanical planarization (CMP) process. The isolation structures 212a-b may be other types of isolation features such as field oxide and LOCal Oxidation of Silicon (LOCOS). The isolation structures 212a-b may include a multi-layer structure, for example, having one or more liner layers.

The structure 200 further includes various gate structures 220a, 220b, and 220c. In the present embodiment, the gate structures 220b and 220c are disposed over the active region 204, while the gate structure 220a is disposed over the isolation structure 212a. Particularly, the gate structures 220b and 220c are disposed over the channel regions 208a and 208b, respectively, for forming field effect transistors. In an embodiment, the gate structure 220a functions as a local interconnect, such as for connecting the S/D 206a to other parts of the device 200. The gate structure 220a includes a gate dielectric layer 222a, a gate electrode layer 224a, an L-shaped spacer 226a, and a sidewall spacer 228a. The gate structure 220b includes a gate dielectric layer 222b, a gate electrode layer 224b, an L-shaped spacer 226b, and a sidewall spacer 228b. The gate structure 220c includes a gate dielectric layer 222c, a gate electrode layer 224c, an L-shaped spacer 226c, and a sidewall spacer 228c.

The gate dielectric layer 222a-c may include silicon oxide layer ($SiO_2$) or a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer 222a-c may be formed by ALD and/or other suitable methods.

The gate electrode layer 224a-c includes polysilicon in an embodiment. Alternatively, the gate electrode layer 224a-c includes a metal such as aluminum (Al), tungsten (W), cobalt (Co), copper (Cu), and/or other suitable materials. The gate electrode layer 224a-c may be formed by CVD, PVD, plating, and/or other suitable processes.

The L-shaped spacer 226a-c may include a dielectric material, such as silicon oxide, silicon oxynitride, other dielectric material, or combinations thereof. The sidewall spacer 228a-c may include a dielectric material, such as silicon oxide, silicon nitride, silicon oxynitride, other dielectric material, or combinations thereof. The L-shaped spacer 226a-c and the sidewall spacer 228a-c may be formed by deposition (e.g., CVD) and etching techniques.

Each of the gate structures 220a-c may further include an interfacial layer under the respective gate dielectric layer, one or more dielectric hard mask layers over the respective gate electrode layer, and/or a work function metal layer. For example, the interfacial layer may include a dielectric material such as silicon oxide layer ($SiO_2$) or silicon oxynitride (SiON), and may be formed by chemical oxidation, thermal oxidation, atomic layer deposition (ALD), CVD, and/or other suitable dielectric. For example, the hard mask layers may include silicon nitride, silicon oxynitride, and/or other suitable dielectric materials. For example, the work function metal layer may be a p-type or an n-type work function layer. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The work function metal layer may include a plurality of layers and may be deposited by CVD, PVD, and/or other suitable process.

Figure 3:
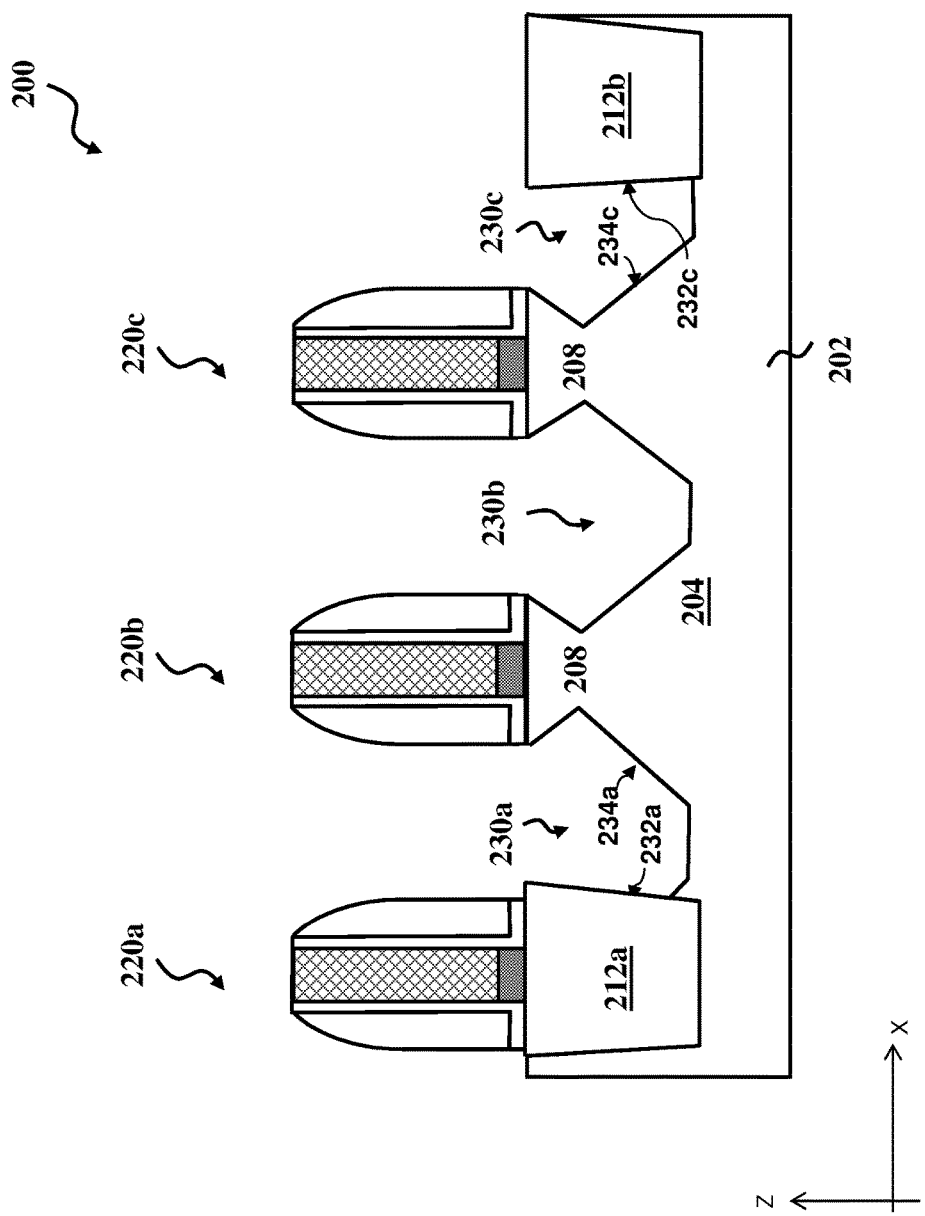

At operation 104, the method 100 (FIG. 1) etches trenches into the S/D regions 206a-c adjacent the gate structures 208b-c. Referring to FIG. 3, trenches 230a, 230b, and 230c are formed into the S/D regions 206a, 206b, and 206c, respectively, for growing epitaxial features therein in subsequent steps. In the present embodiment, the operation 104 includes multiple processes such as a dry etching process, an ion implantation process, a wet etching process, and/or a cleaning process. For example, a dry (anisotropic) etching process may be performed to form substantially U-shaped trenches into the substrate 202. Then, an ion, such as boron, is implanted into the active region 204 to change the crystalline structure of a portion of the active region. Subsequently, a wet (isotropic) etching process is performed to expand the U-shaped trenches. The etching rate in the ion-implanted portion of the active region 204 is higher than other portions. Consequently, the U-shaped trenches are turned into hexagonal shapes like the trench 230b shown in FIG. 3. Then, a cleaning process may clean the trenches 230a-c with DHF, HF, or other suitable solution. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; TMAH solution; a solution containing hydrofluoric acid (HF), nitric acid ($HNO_3$), and/or acetic acid ($CH_3COOH$); or other suitable wet etchant. The etching processes are selective to the material of the substrate 202. In other words, the etching processes are tuned to remove the materials of the substrate 202 but not the isolation structures 212a-b and the outer layers of the gate structures 220a-c. As a result, the trenches 230a and 230c are not in hexagonal shape because one or more of their sidewalls are restricted by the respective isolation structures 212a and 212b.

Still referring to FIG. 3, the trench 230a exposes a portion 232a of a sidewall (or side surface) of the isolation structure 212a. The portion 232a becomes a sidewall of the trench 230a. A sidewall 234a of the trench 230a is opposite to the sidewall 232a with respect to a centerline of the trench 230a. In the present embodiment, the sidewall 234a is oriented in crystalline plane (1, 1, 1). Similarly, the trench 230c exposes a portion 232c of a sidewall of the isolation structure 212b. The portion 232c becomes a sidewall of the trench 230c. A sidewall 234c of the trench 230c is opposite to the sidewall 232c with respect to a centerline of the trench 230c. In the present embodiment, the sidewall 234c is also oriented in crystalline plane (1, 1, 1). Different from the trenches 230a and 230c, the trench 230b is surrounded by semiconductor material(s) of the substrate 202, and has a hexagonal shape in this embodiment. The shapes of the trenches 230a-c may be achieved by tuning parameters of the etching processes, such as etchants used, etching temperature, etching solution concentration, etching pressure, source power, radio frequency (RF) bias voltage, RF bias power, etchant flow rate, and other suitable parameters.

Figure 4:
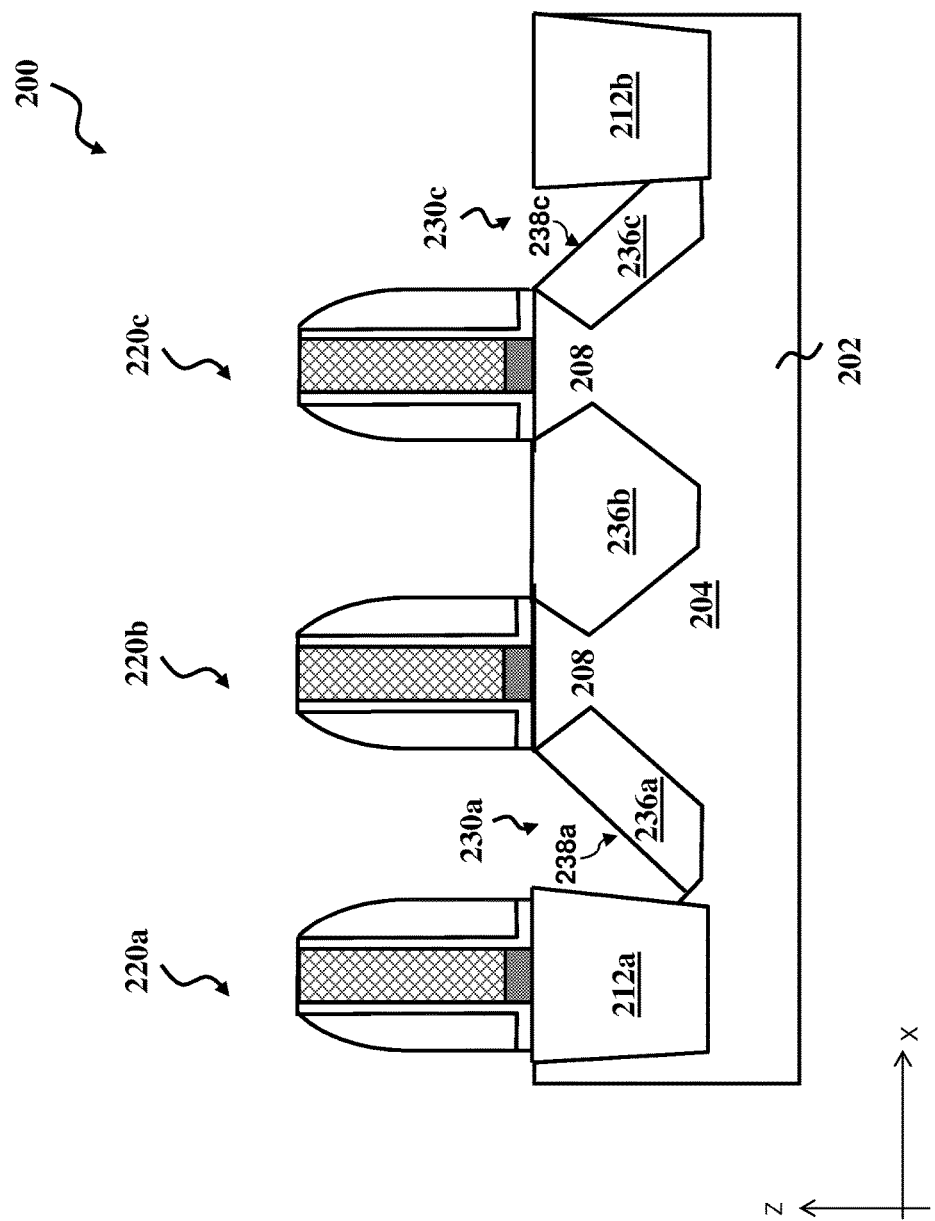

At operation 106, the method 100 (FIG. 1) epitaxially grows a first semiconductor layer 236, including features 236a, 236b, and 236c, in the trenches 230a-c. Referring to FIG. 4, the first semiconductor layer 236a and 236c only partially fill the trenches 230a and 230c respectively, while the first semiconductor layer 236b completely fills the trench 230b in the present embodiment. The different volumes in the first semiconductor layers 236a-c are partially caused by the different materials on their sidewalls. Since the trench 230b (FIG. 3) is surrounded by semiconductor material(s), epitaxial growth of the first semiconductor layer 236b is promoted on all sides of the trench 230b. In contrast, epitaxial growth of the first semiconductor layers 236a and 236c is restricted by the isolation structures 212a and 212b which comprise a dielectric material. As a result, the top surfaces (also side surfaces) 238a and 238c of the first semiconductor layers 236a and 236c, respectively, are slanted with respect to the top surface of the active region 204. In the present embodiment, the top surfaces 238a and 238c are oriented in crystalline plane (1, 1, 1). Further, top surface of the first semiconductor layer 236b is oriented in crystalline plane (0, 0, 1) or an equivalent thereof. The semiconductor layers 236a and 236c may or may not be in direct contact with the isolation structures 212a and 212b, respectively, depending on the profile of the trenches 230a and 230c and the distance between the sidewalls of the isolation structures 212a and 212b and the centerline of the respective trenches 230a and 230c.

The first semiconductor layer 236a-c may comprise silicon, silicon germanium ($Si_{1-x}Ge_x$ or simply SiGe), or other suitable semiconductor material(s). In an embodiment, the first semiconductor layer 236a-c is formed by one or more selective epitaxial growth (SEG) processes. In an embodiment, the SEG process is a low pressure chemical vapor deposition (LPCVD) process using a silicon-based precursor gas. Alternatively, the first semiconductor layer 236a-c may be formed by cyclic deposition and etching (CDE) epitaxy, molecular beam epitaxy (MBE), or other suitable epitaxy techniques.

At operation 108, the method 100 (FIG. 1) dopes the first semiconductor layer 236a-c with appropriate dopant(s). In an embodiment, the first semiconductor layer 236a-c comprises silicon germanium (SiGe) for applying stress and improving charge carrier mobility for PMOS devices. To further this embodiment, the operation 108 dopes the silicon germanium layer 236a-c with a p-type dopant, such as boron. The doping of the silicon germanium layer 236a-c may be performed in-situ. In this case, operations 106 and 108 are performed simultaneously. For example, the epitaxial growth process may use boron-containing gases such as diborane ($B_2H_6$), other p-type dopant-containing gases, or a combination thereof to dope the silicon germanium layer 236a-c with a p-type dopant in-situ. Alternatively, if the silicon germanium layer 236a-c is not doped during the epitaxial growth process, it may be doped in a subsequent process (ex-situ), for example, by an ion implantation process, plasma immersion ion implantation (PIII) process, other process, or a combination thereof. In this case, the operation 108 is performed after the operation 106. An annealing process, such as a rapid thermal annealing and/or a laser thermal annealing, may be performed to activate dopants in the silicon germanium layer 236a-c.

In another embodiment, the first semiconductor layer 236a-c comprises silicon for applying stress and improving charge carrier mobility for NMOS devices. To further this embodiment, the operation 108 dopes the silicon layer 236a-c with an n-type dopant, such as phosphorus, arsenic, or combinations thereof. Similar to the above discussion, the doping of the silicon layer 236a-c may be performed in-situ or ex-situ.

Figure 5:
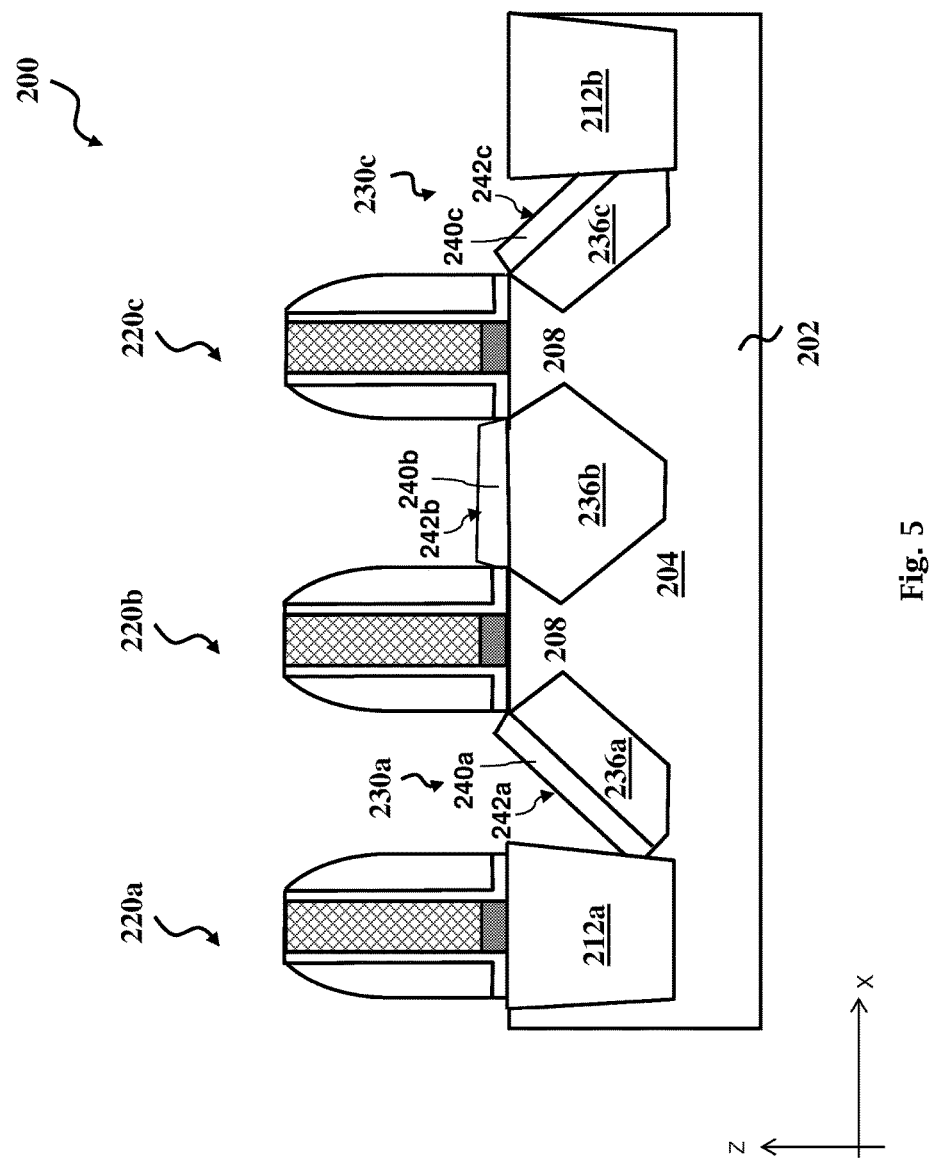

At operation 110, the method 100 (FIG. 1) epitaxially grows a second semiconductor layer 240, including features 240a, 240b, and 240c, over the first semiconductor layer 236a-c. Referring to FIG. 5, the second semiconductor layer 240a-c is disposed over top surfaces of the first semiconductor layer 236a-c. In the present embodiment, the second semiconductor layer 240a-c comprises silicon. In alternative embodiments, the second semiconductor layer 240a-c comprises another elementary, compound, or alloy semiconductor material. In the present embodiment, the second semiconductor layer 240a has a top surface (which is also a side surface) 242a that is oriented in the crystalline plane (1, 1, 1), the second semiconductor layer 240b has a top surface 242b that is oriented in the crystalline plane (0, 0, 1) or an equivalent thereof, and the second semiconductor layer 240c has a top surface (which is also a side surface) 242c that is oriented in the crystalline plane (1, 1, 1). In embodiments, the second semiconductor layer 240a-c may be epitaxially grown using SEG, MBE, CDE, or other suitable epitaxy techniques. For example, the second semiconductor layer 240a-c may be epitaxially grown using a silicon-containing precursor gas, such as $SiH_2Cl_2$ (DCS).

It is noted that the first and second semiconductor layers 236 and 240 still only partially fill the trenches 230a and 230c because the epitaxial growth there is limited by the isolation structure 212a-b. If S/D contact features were formed directly over the second semiconductor layer 240a-c, the contact features would not land properly on the features 240a and 240c due to the slanted surfaces, which might lead to device defects (e.g., open circuits). Furthermore, the features 240a and 240c are thinner than the feature 240b as measured along a direction that is normal to the respective top surfaces 242a, 242b, and 242c. This is because the second semiconductor layer 240 (e.g., silicon) has a smaller growth rate in the crystalline plane (1, 1, 1) than in the crystalline plane (0, 0, 1). Therefore, the layers 240a and 240c may not have sufficient thickness for S/D contact formation. For example, S/D contact hole etching may completely penetrate the layers 240a and 240c, leading to increased S/D contact resistance. On the other hand, continuing the growth of the layers 240a-c may cause overgrowth of the layer 240b, which may lead to shorting of layer 240b with nearby circuit features (not shown). In the present embodiment, the method 100 performs few subsequent processes to overcome the above issues.

Figure 6:
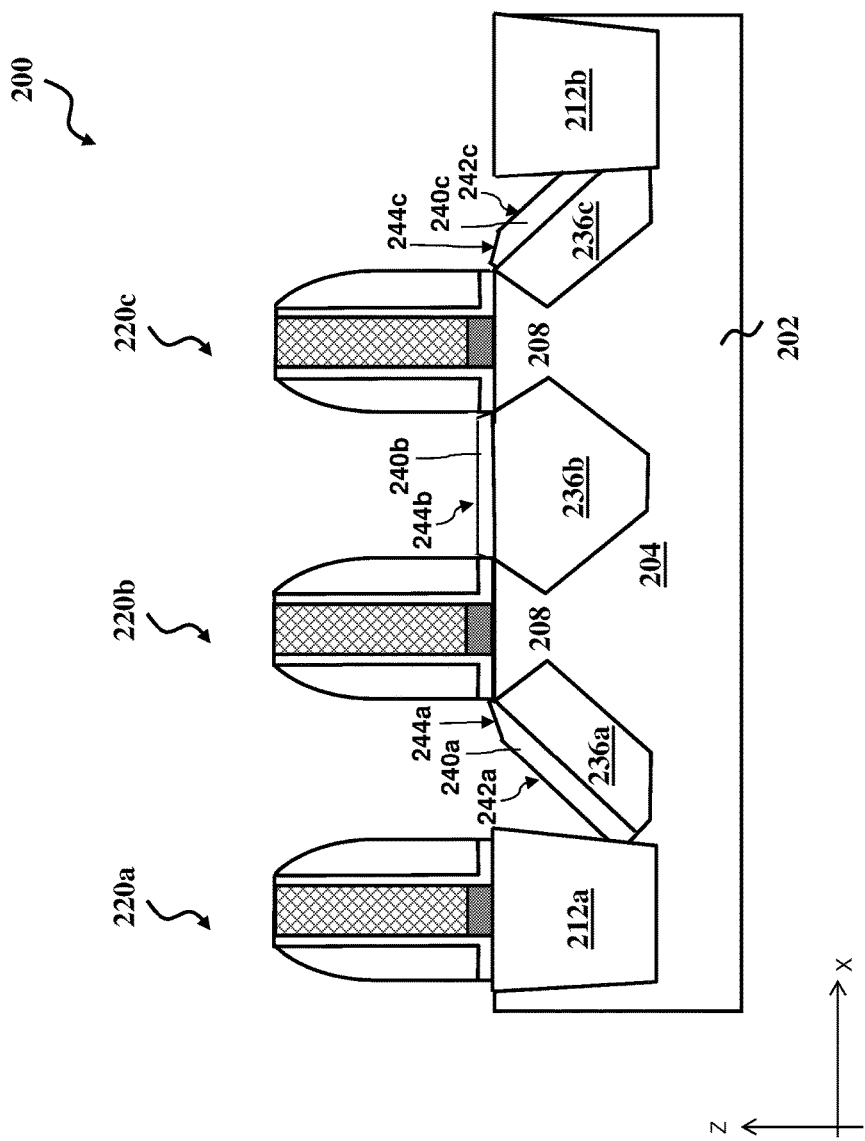

At operation 112, the method 100 (FIG. 1) etches the second semiconductor layer 240 to change a crystalline facet orientation of at least a portion of the surfaces 242a and 242c. Referring to FIG. 6, the operation 112 produces new surfaces 244a, 244b, and 244c on the second semiconductor layer 240a, 240b, and 240c respectively. The crystalline facet orientation of the surface 244b is about the same as the surface 242b, though the layer 240b may be reduced in its thickness along the Z direction which is normal to the top surface of the active region 204. The surfaces 244a and 244c have different crystalline facet orientation than the surfaces 242a and 242c, respectively. In the present embodiment, each of the surfaces 242a and 242c is in crystalline plane (1, 1, 1), and each of the surfaces 244a and 244c is in the crystalline plane (3, 1, 1) or its equivalent (1, 3, 1) and (1, 1, 3). In various embodiments, each of the surfaces 244a and 244c may be oriented in one of the crystalline planes of (3, 1, 1), (5, 1, 1), (7, 1, 1), (9, 1, 1), (1, 3, 1), (1, 5, 1), (1, 7, 1), (1, 9, 1), (1, 1, 3), (1, 1, 5), (1, 1, 7), and (1, 1, 9), which can also be expressed as {3, 1, 1}, {5, 1, 1}, {7, 1, 1}, and {9, 1, 1} for simplification. In the present embodiment, the operation 112 etches the second semiconductor layer 240 using a chemical having hydrogen chloride (HCl).

Alternatively, the operation 112 may employ another chemical such as a hydride (e.g., HCl, HBr, HI, or HAt). The chemical etches the upper corner (see FIG. 5) of the layers 240a and 240c faster than it etches the lower body of the layers 240a and 240c, thereby forming the surfaces 244a and 244c. Furthermore, the chemical is tuned to selectively etch the second semiconductor layer 240 but not the gate structures 220a-c and the isolation structures 212a-b in the present embodiment.

Figure 7:
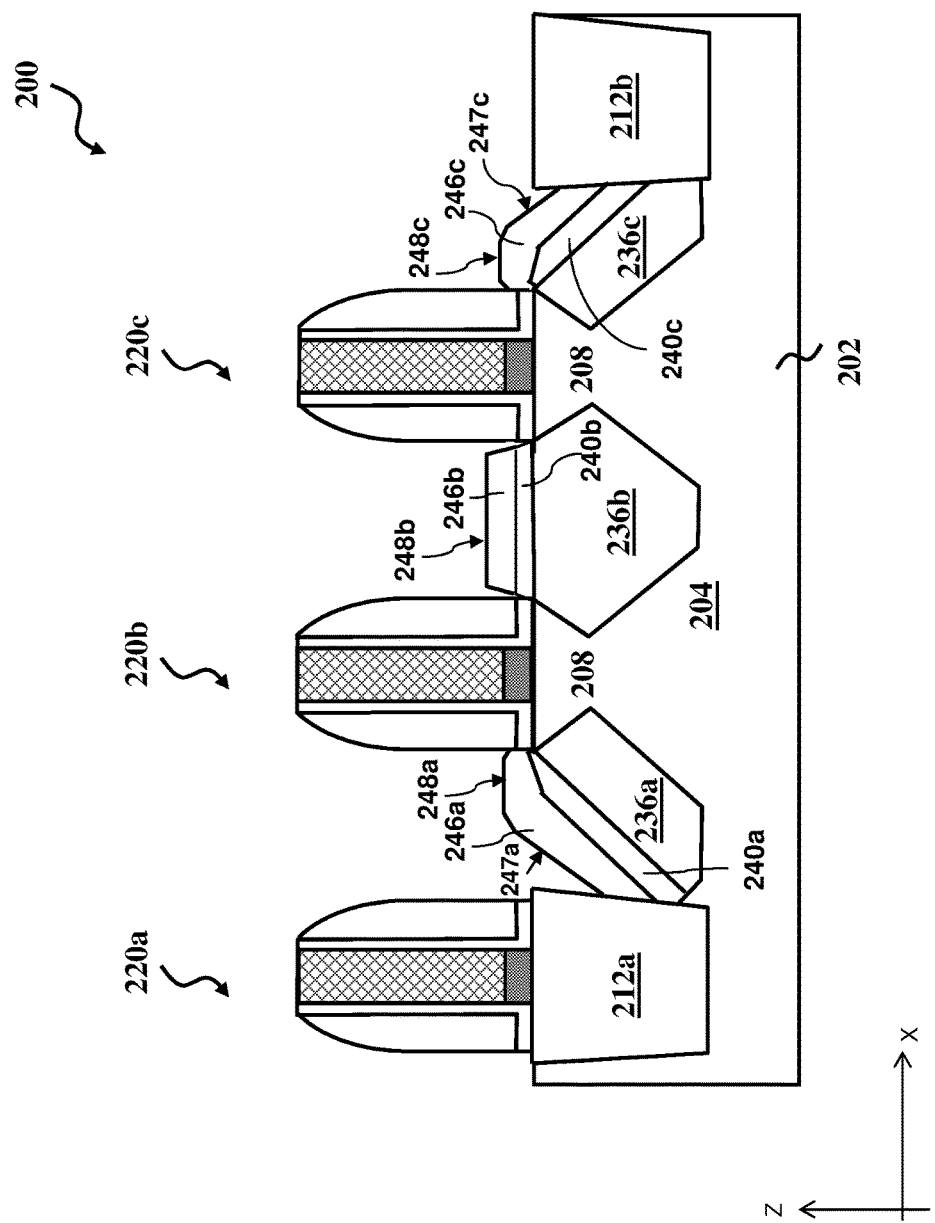

At operation 114, the method 100 (FIG. 1) epitaxially grows a third semiconductor layer 246, including features 246a, 246b, and 246c, over the second semiconductor layer 240a-c (FIG. 7). The third semiconductor layer 246 may comprise silicon or other suitable semiconductor material(s). In various embodiments, the operation 114 may grow the third semiconductor layer 246 using SEG, MBE, CDE, or other epitaxy techniques. For example, the operation 114 may epitaxially grow the third semiconductor layer 246 using a silicon-containing precursor gas such as $SiH_2Cl_2$ (DCS) with 1% $B_2H_6$ gas.

Referring to FIG. 7, the features 246a-c have multiple facets in their respective outer surfaces in the present embodiment. For example, the feature 246a has a side surface 247a and a top surface 248a. The side surface 247a is oriented in crystalline plane (1, 1, 1), and the top surface 248a is oriented in crystalline plane (0, 0, 1) or an equivalent thereof, which is parallel to a top surface of the active region 204 in an embodiment. The side surface 247a transitions to the top surface 248a through one or more facets. The thickness of the layer 246a increases from a lower part thereof (adjacent the isolation structure 212a) to an upper part thereof (above the top surface of the active region 204).

Similarly, the feature 246c has a side surface 247c and a top surface 248c. The side surface 247c is oriented in crystalline plane (1, 1, 1), and the top surface 248c is oriented in crystalline plane (0, 0, 1) or an equivalent thereof, which is parallel to the top surface of the active region 204 in an embodiment. The thickness of the layer 246c increases from a lower part thereof (adjacent the isolation structure 212b) to an upper part thereof (above the top surface of the active region 204). The feature 246b provides a top surface 248b oriented in crystalline plane (0, 0, 1) in the present embodiment.

The second and third semiconductor layers 240 and 246 collectively provide a desirably thick semiconductor layer for S/D contact landing. Particularly, the top surfaces 248a and 248c provide a flat or nearly flat surface for supporting S/D contacts to be formed thereon.

At operation 116, the method 100 (FIG. 1) dopes the third semiconductor layer 246a-c with appropriate dopant(s). The third semiconductor layer 246a-c may be doped in-situ (in which case, the operations 116 and 114 are performed simultaneously), or ex-situ (in which case, the operation 116 is performed after the operation 114), as discussed above with respect to the operation 108. In an exemplary embodiment, the third semiconductor layer 246a-c comprises silicon and is in-situ doped with boron by using boron-containing gases such as diborane ($B_2H_6$) during the epitaxial growth process.

In the present embodiment, the dopant(s) applied to the third semiconductor layer 246a-c is of the same type as the dopant(s) applied to the first semiconductor layer 236a-c. For example, they are both p-type dopant(s), or are both n-type dopant(s). In a further embodiment, the first and third semiconductor layers 236a-c and 246a-c are doped with the same dopant, but the layer 246a-c has a higher dopant concentration than the layer 236a-c. One purpose of this configuration is to reduce contact resistance between the layer 246a-c and S/D contact features to be formed thereon. In an example, the first semiconductor layer 236a-c comprises silicon germanium doped with boron with a boron concentration ranging from 1E17 to 1E20 atoms/cm$^3$, and the third semiconductor layer 246a-c comprises silicon doped with boron with a boron concentration ranging from 1E20 to over 1E21 atoms/cm$^3$. It is noted that the second semiconductor layer 240a-c may or may not be intentionally doped. In some embodiments, the dopants in the layers 236a-c and 246a-c may diffuse into the second semiconductor layer 240a-c, thereby doping the second semiconductor layer 240a-c nonetheless. In some embodiments, the dopant concentration in the second semiconductor layer 240a-c is lower than that of the third semiconductor layer 246a-c, and is also lower than that of the first semiconductor layer 236a-c at least at the boundary of the first and second semiconductor layers. In one example, the second semiconductor layer 240a-c comprises silicon doped with boron with a boron concentration ranging from 1E19 to 1E20 atoms/cm$^3$.

Still referring to FIG. 7, the method 100 has formed three epitaxial semiconductor layers 236a-c, 240a-c, and 246a-c. Particularly, a three-layer epitaxial structure is formed in each of the S/D regions 206a-c (FIG. 1). In the S/D region 206a, the three-layer epitaxial structure includes the layers 236a, 240a, and 246a bordering the isolation structure 212a. Particularly, each of the layers 240a and 246a is in direct contact with the isolation structure 212a. In the S/D region 206b, the three-layer epitaxial structure includes the layers 236b, 240b, and 246b surrounded by semiconductor material(s). In the S/D region 206c, the three-layer epitaxial structure includes the layers 236c, 240c, and 246c bordering the isolation structure 212b. Particularly, each of the layers 240c and 246c is in direct contact with the isolation structure 212b. In an embodiment, the first semiconductor layer 236a-c has a thickness ranging from 20 to 40 nm, the second semiconductor layer 240a-c has a thickness ranging from 2 to 10 nm, and the third semiconductor layer 246a-c has a thickness ranging from 5 to 10 nm.

Figure 8:
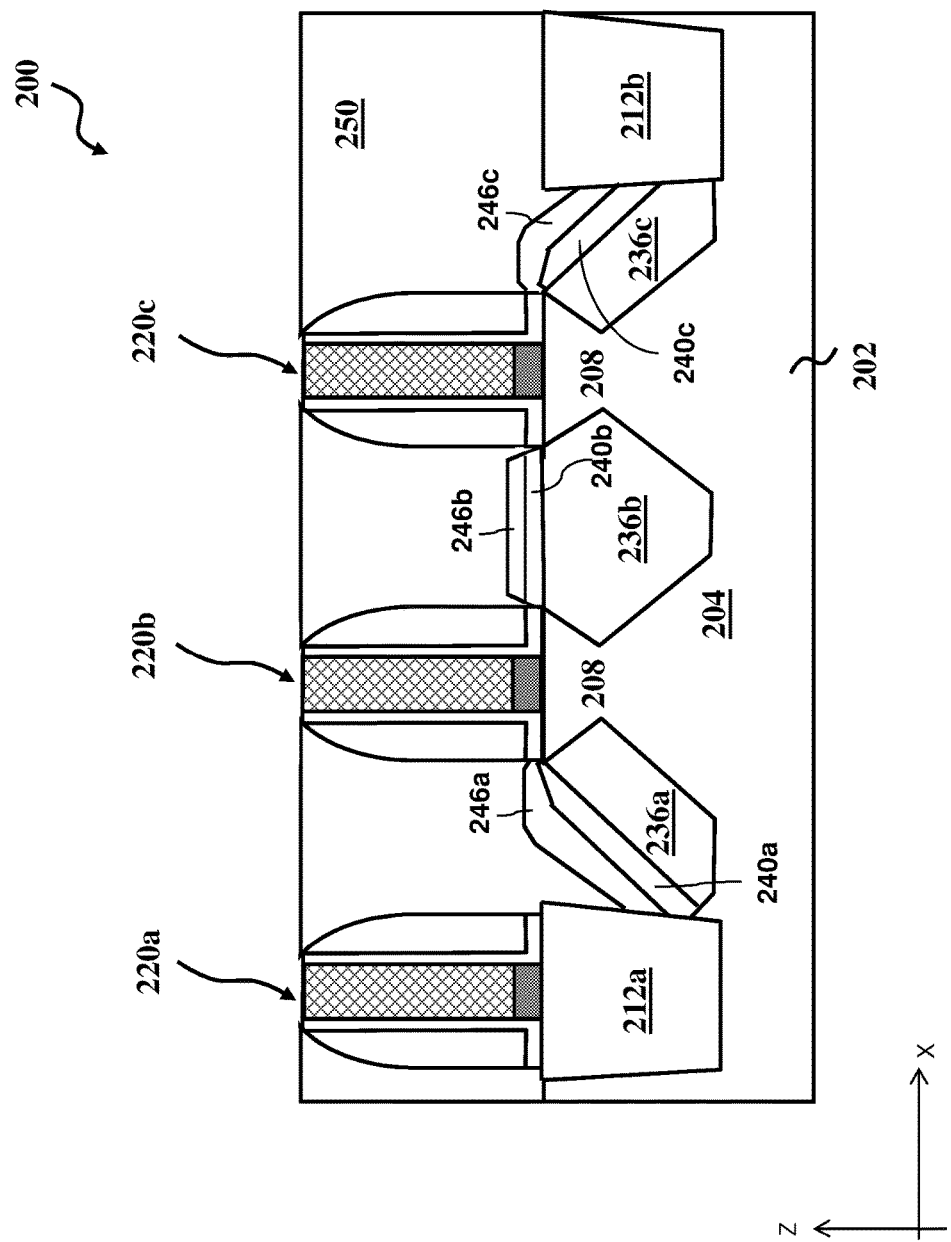

At operation 118, the method 100 (FIG. 1) forms an inter-layer dielectric (ILD) layer 250 over the substrate 202, the gate structures 220a-c, the isolation structures 212a-b, and the third semiconductor layer 246a-c (FIG. 8). In an embodiment, the method 100 forms an etch stop layer (not shown) over the various structures before the forming of the ILD layer 250. Examples of materials that may be used to form the etch stop layer include silicon nitride, silicon oxide, silicon oxynitride, and/or other materials. The etch stop layer may be formed by PECVD process and/or other suitable deposition or oxidation processes. The ILD layer 250 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 250 may be deposited by a PECVD process, flowable CVD process, or other suitable deposition technique.

Figure 9:
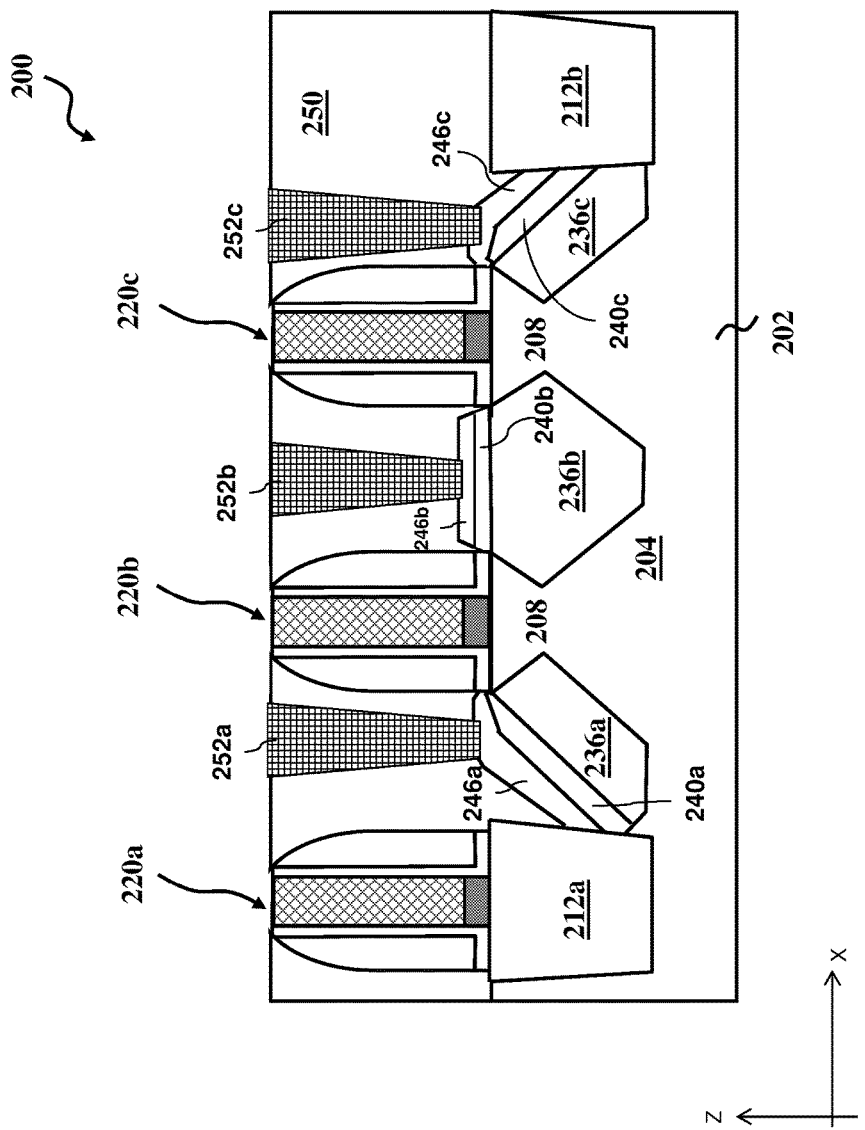

At operation 120, the method 100 (FIG. 1) forms conductive features 252a-c in the ILD layer 250 and electrically contacting the third semiconductor layer 246a-c, respectively. Referring to FIG. 9, the conductive feature 252b is disposed on a flat surface of the third semiconductor layers 246b, and the conductive features 252a and 252c are disposed on a relatively flat and thick part of the third semiconductor layers 246a and 246c, respectively. This advantageously provides good contact between the respective conductive feature and the semiconductor layer, and reduces the contact resistance thereof. The operation 120 may include a variety of processes including etching contact holes to expose the third semiconductor layer 246a-c and depositing the conductive features 252a-c in the contact holes. Each of the contact features 252a-c may include multiple layers, such as a barrier/adhesion layer and a metal fill layer over the barrier/adhesion layer. For example, the barrier/adhesion layer may include titanium, titanium nitride, tantalum, tantalum nitride, a combination thereof, or other suitable materials. The barrier/adhesion layer may be formed by CVD, PVD, or other suitable processes. For example, the metal fill layer may include aluminum (Al), tungsten (W), cobalt (Co), copper (Cu), and/or other suitable materials. The metal fill layer may be formed by CVD, PVD, plating, and/or other suitable processes.

At operation 122, the method 100 (FIG. 1) performs other fabrication steps to the structure 200 in order to form a final IC product. For example, the method 100 may perform a gate replacement process. The gate replacement process replaces the gate dielectric layer 222a-c and the gate electrode layer 224a-c, which are originally silicon oxide and polysilicon in an embodiment, with a high-k gate dielectric layer and a metal gate electrode layer. The gate replacement process may be performed before or after the operation 120. For another example, the method 100 may form gate contacts over the gate structures 220a-c. The gate contacts may be formed before, during, or after the operation 120. For yet another example, the method 100 may form an interconnect structure that connects the gate structures 220a-c, the conductive features 252a-c, and other parts of the device 200 (not shown). In a particular example, the interconnect structure may connect the gate structure 220a with the conductive feature 252a, in which case the gate structure 220a functions as a local interconnect for electrically connecting the S/D feature (236a/240a/246a) to a source, drain, or gate terminal of another transistor.

Although not intended to be limiting, one or more embodiments of the present disclosure provide many benefits to a semiconductor device and the formation thereof. For example, embodiments of the present disclosure provide a three-layer epitaxial feature. The three-layer epitaxial feature provides good landing areas for S/D contact, which leads to reduced S/D contact resistance.

In one exemplary aspect, the present disclosure is directed to a method for semiconductor manufacturing. The method includes providing a semiconductor structure having an active region and an isolation structure adjacent to the active region, the active region having source and drain regions sandwiching a channel region for a transistor, the semiconductor structure further having a gate structure over the channel region. The method further includes etching a trench in one of the source and drain regions, wherein the trench exposes a portion of a sidewall of the isolation structure, epitaxially growing a first semiconductor layer in the trench, epitaxially growing a second semiconductor layer over the first semiconductor layer, changing a crystalline facet orientation of a portion of a top surface of the second semiconductor layer by an etching process, and epitaxially growing a third semiconductor layer over the second semiconductor layer after the changing of the crystalline facet orientation.

In another exemplary aspect, the present disclosure is directed to a method for making a semiconductor device. The method includes providing a semiconductor structure having an active region and an isolation structure adjacent to the active region, the active region having source and drain regions sandwiching a channel region for a transistor, the semiconductor structure further having a gate structure over the channel region. The method further includes etching a trench in one of the source and drain regions, wherein a first side surface of the trench is a portion of a sidewall of the isolation structure, and a second side surface of the trench is oriented in crystalline plane (1, 1, 1). The method further includes epitaxially growing a first semiconductor layer in the trench, and epitaxially growing a second semiconductor layer over the first semiconductor layer, wherein a top surface of the second semiconductor layer is oriented in crystalline plane (1, 1, 1). The method further includes etching the second semiconductor layer, thereby changing crystalline facet orientation of a portion of the top surface of the second semiconductor layer. The method further includes epitaxially growing a third semiconductor layer over the second semiconductor layer after the etching of the second semiconductor layer.

In another exemplary aspect, the present disclosure is directed to a semiconductor device. The semiconductor device includes a substrate having an active region, the active region having source and drain regions sandwiching a channel region. The semiconductor device further includes a gate structure over the channel region, an isolation structure at least partially embedded in the substrate, a first semiconductor layer embedded in a trench in one of the source and drain regions, a second semiconductor layer over the first semiconductor layer, and a third semiconductor layer over the second semiconductor layer. Each of the second and third semiconductor layers is in direct contact with the isolation structure. A first side surface of the second semiconductor layer is oriented in crystalline plane (1, 1, 1), and a second side surface of the second semiconductor layer is oriented in one of crystalline planes of {3, 1, 1}, {5, 1, 1}, {7, 1, 1}, and {9, 1, 1}.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a structure having a semiconductor substrate with an active region, the active region having source and drain regions, the structure further having an isolation structure at least partially embedded in the semiconductor substrate;
   etching a trench in one of the source and drain regions, the trench exposing a portion of the isolation structure;
   forming a first semiconductor layer in the trench;
   forming a second semiconductor layer over the first semiconductor layer;
   changing a crystalline facet orientation of a portion of a surface of the second semiconductor layer by an etching process; and
   after the changing of the crystalline facet orientation, forming a third semiconductor layer over the second semiconductor layer.

2. The method of claim 1, wherein each of the second and third semiconductor layers is in direct contact with the isolation structure, wherein a first side surface of the second semiconductor layer is oriented in crystalline plane (1, 1, 1), and a second side surface of the second semiconductor layer is oriented in one of crystalline planes of {3, 1, 1}, {5, 1, 1}, {7, 1, 1}, and {9, 1, 1}.

3. The method of claim 1, further comprising:
   forming an inter-layer dielectric (ILD) layer over the active region and the isolation structure; and
   forming a conductive feature embedded in the ILD layer and contacting the third semiconductor layer.

4. The method of claim 1, wherein the first semiconductor layer comprises silicon germanium doped with a p-type dopant, and each of the second and third semiconductor layers comprises silicon doped with the p-type dopant.

5. The method of claim 1, wherein the etching process uses a chemical including hydrogen chloride (HCl).

6. A method, comprising:
   providing a semiconductor structure having an active region and an isolation structure adjacent to the active region, the active region having source and drain regions sandwiching a channel region for a transistor, the semiconductor structure further having a gate structure over the channel region;
   etching a trench in one of the source and drain regions, wherein the trench exposes a portion of a sidewall of the isolation structure;
   epitaxially growing a first semiconductor layer in the trench;
   epitaxially growing a second semiconductor layer over the first semiconductor layer;
   changing a crystalline facet orientation of a portion of a top surface of the second semiconductor layer by an etching process; and
   after the changing of the crystalline facet orientation, epitaxially growing a third semiconductor layer over the second semiconductor layer.

7. The method of claim 6, wherein before the changing of the crystalline facet orientation, the portion of the top surface of the second semiconductor layer is in crystalline plane (1, 1, 1), and after the changing of the crystalline facet orientation, the portion of the top surface of the second semiconductor layer is in one of crystalline planes of: (3, 1, 1), (5, 1, 1), (7, 1, 1), (9, 1, 1), (1, 3, 1), (1, 5, 1), (1, 7, 1), (1, 9, 1), (1, 1, 3), (1, 1, 5), (1, 1, 7), and (1, 1, 9).

8. The method of claim 6, further comprising:
   forming an inter-layer dielectric (ILD) layer over the third semiconductor layer; and
   forming a contact feature in the ILD layer and contacting the third semiconductor layer.

9. The method of claim 6, wherein the first and second semiconductor layers collectively partially fill the trench.

10. The method of claim 6, wherein the etching process uses a chemical including hydrogen chloride (HCl).

11. The method of claim 6, wherein the first semiconductor layer includes silicon germanium.

12. The method of claim 11, further comprising:
    doping the first semiconductor layer with a p-type dopant before the epitaxially growing of the second semiconductor layer.

13. The method of claim 12, wherein each of the second and third semiconductor layers includes silicon.

14. The method of claim 13, further comprising:
    doping the third semiconductor layer with the p-type dopant.

15. A method, comprising:
    providing a semiconductor structure having an active region and an isolation structure adjacent to the active region, the active region having source and drain regions sandwiching a channel region for a transistor, the semiconductor structure further having a gate structure over the channel region;
    etching a trench in one of the source and drain regions, wherein a first side surface of the trench is a portion of a sidewall of the isolation structure, and a second side surface of the trench is oriented in crystalline plane (1, 1, 1);
    epitaxially growing a first semiconductor layer in the trench;

epitaxially growing a second semiconductor layer over the first semiconductor layer, wherein a top surface of the second semiconductor layer is oriented in crystalline plane (1, 1, 1);

etching the second semiconductor layer, thereby changing crystalline facet orientation of a portion of the top surface of the second semiconductor layer; and after the etching of the second semiconductor layer, epitaxially growing a third semiconductor layer over the second semiconductor layer.

16. The method of claim 15, wherein after the etching of the second semiconductor layer, the crystalline facet orientation of the portion of the top surface of the second semiconductor layer is in one of crystalline planes of: {3, 1, 1}, {5, 1, 1}, {7, 1, 1}, and {9, 1, 1}.

17. The method of claim 15, wherein the etching of the second semiconductor layer uses a chemical including hydrogen chloride (HCl).

18. The method of claim 15, wherein the first semiconductor layer comprises silicon doped with an n-type dopant.

19. The method of claim 15, wherein the first semiconductor layer comprises silicon germanium doped with boron.

20. The method of claim 19, wherein each of the second and third semiconductor layers comprises silicon doped with boron.

* * * * *